(12) United States Patent
Godfrey

(10) Patent No.: US 11,264,778 B2
(45) Date of Patent: Mar. 1, 2022

(54) QUAD FLAT NO-LEADS PACKAGE FOR SIDE EMITTING LASER DIODE

(71) Applicant: Excelitas Canada, Inc., Vaudreuil-Dorion (CA)

(72) Inventor: Lawrence Godfrey, Nanaimo (CA)

(73) Assignee: Excelitas Canada, Inc., Vaudreuil-Dorion (CA)

( * ) Notice: Subject to any disclaimer, the term of this patent is extended or adjusted under 35 U.S.C. 154(b) by 24 days.

(21) Appl. No.: 16/666,792

(22) Filed: Oct. 29, 2019

(65) Prior Publication Data

US 2020/0144786 A1    May 7, 2020

Related U.S. Application Data

(60) Provisional application No. 62/754,176, filed on Nov. 1, 2018.

(51) Int. Cl.
*H01S 5/02355*    (2021.01)
*H01S 5/02234*    (2021.01)

(52) U.S. Cl.
CPC ...... *H01S 5/02355* (2021.01); *H01S 5/02234* (2021.01)

(58) Field of Classification Search
CPC ............. H01S 5/02228; H01S 5/02234; H01S 5/02355; H01S 5/0231; H01S 5/0225; H01S 5/022; H01Q 9/0485
See application file for complete search history.

(56) References Cited

U.S. PATENT DOCUMENTS

| | | | |
|---|---|---|---|
| 7,400,791 B2 | 7/2008 | Kagaya | |
| 8,447,153 B2 | 5/2013 | Douma et al. | |
| 8,831,061 B2 | 9/2014 | Lauer et al. | |
| 8,882,310 B2 * | 11/2014 | Mandelboum ..... | G02B 27/0938 362/373 |

(Continued)

FOREIGN PATENT DOCUMENTS

| | | |
|---|---|---|
| DE | 102016208431 | 11/2017 |
| EP | 2 738 806 | 6/2014 |

(Continued)

OTHER PUBLICATIONS

International Search Report and Written Opinion for PCT/US2019/058445 dated Jan. 23, 2020.

(Continued)

*Primary Examiner* — Tuan N Nguyen
(74) *Attorney, Agent, or Firm* — Peter A. Nieves; Sheehan Phinney; Bass & Green PA

(57) ABSTRACT

A semiconductor package is manufactured by physically attaching a side emitting laser diode to a floor portion of a recessed flat no-leads (FNL) package having a wall extending from and surrounding a perimeter of a recessed floor portion. The attached side emitting laser diode is oriented to direct a laser beam toward an opposing portion of the wall. The FNL package is singulated into a first piece and a second piece along a singulation plane through the FNL package wall and floor portion between the side emitting laser diode and the opposing portion of the wall. After singulation the opposing portion of the wall is in the second piece and the side emitting laser diode is in the first piece.

20 Claims, 11 Drawing Sheets

(56) References Cited

U.S. PATENT DOCUMENTS

| | | | | |
|---|---|---|---|---|
| 8,888,331 | B2* | 11/2014 | Mandelboum | G01S 7/4814 362/311.01 |
| 9,337,613 | B1 | 5/2016 | Lim et al. | |
| 9,509,117 | B2 | 11/2016 | Schwarz et al. | |
| 9,722,394 | B2 | 8/2017 | Lauer et al. | |
| 10,297,380 | B2 | 5/2019 | Ryu et al. | |
| 2005/0041934 | A1 | 2/2005 | Zama et al. | |
| 2007/0014321 | A1 | 1/2007 | Shimotsu | |
| 2007/0228535 | A1* | 10/2007 | Fujino | H01S 5/0231 257/678 |
| 2008/0048203 | A1* | 2/2008 | Son | H01L 33/486 257/98 |
| 2009/0059981 | A1* | 3/2009 | Mizusako | H05B 45/3725 372/38.02 |
| 2009/0135878 | A1 | 5/2009 | Yamaguchi et al. | |
| 2009/0321777 | A1 | 12/2009 | Mitsuyama et al. | |
| 2013/0001599 | A1* | 1/2013 | Lee | H01L 33/502 257/88 |
| 2013/0195134 | A1 | 8/2013 | Okahisa et al. | |
| 2013/0248896 | A1* | 9/2013 | Lee | H01L 33/64 257/88 |
| 2013/0334544 | A1* | 12/2013 | Luruthudass | H01L 31/12 257/82 |
| 2015/0255949 | A1* | 9/2015 | Lee | H01S 5/02407 372/36 |
| 2016/0133534 | A1* | 5/2016 | Lopez | H01L 24/97 257/773 |
| 2016/0268770 | A1* | 9/2016 | Tazawa | H01S 5/02208 |
| 2016/0285233 | A1 | 9/2016 | Victoria et al. | |
| 2017/0338626 | A1 | 11/2017 | Eichler et al. | |
| 2018/0045882 | A1 | 2/2018 | Chojnacki et al. | |
| 2018/0145478 | A1 | 5/2018 | Sakai et al. | |
| 2018/0254605 | A1* | 9/2018 | Wojcik | H01S 3/027 |
| 2018/0261731 | A1* | 9/2018 | Wojcik | H01L 33/54 |
| 2018/0278017 | A1 | 9/2018 | Mignoli et al. | |
| 2019/0006818 | A1 | 1/2019 | Minato et al. | |
| 2019/0019925 | A1 | 1/2019 | Morita | |
| 2019/0036299 | A1 | 1/2019 | Wojcik et al. | |
| 2019/0067901 | A1 | 2/2019 | Khassine et al. | |
| 2019/0115505 | A1 | 4/2019 | Tsai et al. | |
| 2019/0146319 | A1 | 5/2019 | Stapleton et al. | |
| 2019/0259924 | A1 | 8/2019 | Ho et al. | |
| 2019/0260179 | A1 | 8/2019 | Ueyama et al. | |

FOREIGN PATENT DOCUMENTS

| | | |
|---|---|---|
| WO | 2017198668 | 11/2017 |
| WO | 2018011279 | 1/2018 |
| WO | 2018122103 | 7/2018 |
| WO | 2018188910 | 10/2018 |
| WO | 2018192972 | 10/2018 |
| WO | 2018234068 | 12/2018 |
| WO | 2019020761 | 1/2019 |

OTHER PUBLICATIONS

International Search Report and Written Opinion for PCT/US2019/0058432 dated Feb. 3, 2020.

* cited by examiner

A side emitting laser diode is attached to a floor portion of a recessed QFN package, such that the side emitting laser diode is oriented to direct a laser beam toward an opposing portion of a wall extending upward from and substantially surrounding a recessed floor portion
610

A singulation plane is determined between the side emitting laser diode and the opposing portion of the wall
620

The QFN package is singulated into a first piece and a second piece along the singulation plane, so that after singulation the opposing portion of the wall is in the second piece and the side emitting laser diode is in the first piece
630

A side sensing electronic component is attached to a floor portion of a recessed QFN package, such that the sensing electronic component is oriented to direct its sensing surface toward an opposing portion of a wall extending upward from and substantially surrounding a recessed floor portion
710

A singulation plane is determined between the side sensing electronic component and the opposing portion of the wall
720

The QFN package is singulated into a first piece and a second piece along the singulation plane, so that after singulation the opposing portion of the wall is in the second piece and the side sensing electronic component is in the first piece
730

QUAD FLAT NO-LEADS PACKAGE FOR SIDE EMITTING LASER DIODE

CROSS-REFERENCE TO RELATED APPLICATIONS

This application claims the benefit of U.S. Provisional Patent Application Ser. No. 62/754,176, filed Nov. 1, 2018, entitled "Method for Adapting a Quad Flat No-leads Package for Side Emitting Laser Diode," which is incorporated by reference herein in its entirety.

FIELD OF THE INVENTION

The present invention relates to semiconductor packaging, and more particularly, is related to a laser diode package.

BACKGROUND OF THE INVENTION

Laser diodes are available in various packaging arrangements, for example, in metal cans, plastic packages, and mounted on printed circuit boards (PCB). However, incorporating many of these packages into high performance circuits results in lead line lengths that may be problematic in some applications. Further, such packages may not be appropriate for deployment of laser diodes in certain environments due to size and/or thermal limitations. Unfortunately, providing a custom laser diode packaging to overcome these shortcomings may be cost prohibitive. Therefore, there is a need in the industry to overcome one or more of these shortcomings.

SUMMARY OF THE INVENTION

Embodiments of the present invention provide a quad flat no-leads package for a side emitting laser diode and a method for adapting a quad flat no-leads package for a side emitting laser diode. Briefly described, the present invention is directed to a semiconductor package manufactured by physically attaching a side emitting laser diode to a floor portion of a recessed flat no-leads (FNL) package having a wall extending from and surrounding a perimeter of a recessed floor portion. The attached side emitting laser diode is oriented to direct a laser beam toward an opposing portion of the wall. The FNL package is singulated into a first piece and a second piece along a singulation plane through the FNL package wall and floor portion between the side emitting laser diode and the opposing portion of the wall. After singulation the opposing portion of the wall is in the second piece and the side emitting laser diode is in the first piece.

Other systems, methods and features of the present invention will be or become apparent to one having ordinary skill in the art upon examining the following drawings and detailed description. It is intended that all such additional systems, methods, and features be included in this description, be within the scope of the present invention and protected by the accompanying claims.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principals of the invention.

FIG. 6 is a flowchart of an exemplary method for forming a modified QFN laser diode package.

FIG. 7 is a flowchart of an exemplary method for forming a modified QFN package for a side-oriented sensing device.

DETAILED DESCRIPTION OF THE DRAWINGS

Figure 1A:
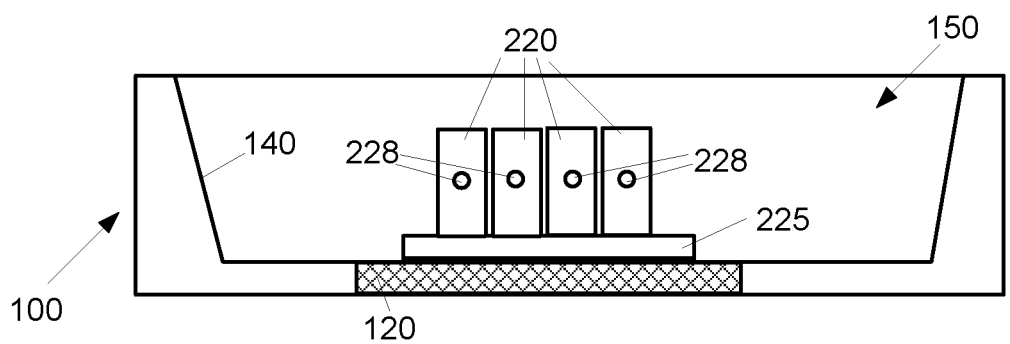
FIG. 1A is a side cutaway view of a recessed QFN package with a laser diode array mounted in the recess.

The following definition is useful for interpreting terms applied to features of the embodiments disclosed herein. As used within this disclosure, "substantially" means "very nearly," or generally within normal manufacturing tolerances.

As used within this disclosure, a flat no-leads package, for example, quad-flat no-leads (QFN) and dual-flat no-leads (DFN) provide physical and electrical connectivity to printed circuit boards (PCB) for electronic components, for example (but not limited to) integrated circuits. Flat no-leads, also known as micro leadframe (MLF) and SON (small-outline no leads), is a surface-mount technology, one of several package technologies that connect ICs to the surfaces of PCBs without through-holes. Flat no-lead is typically a near chip scale plastic encapsulated package made with a copper lead frame substrate. Perimeter lands on the package bottom provide electrical connections to the PCB. Flat no-lead packages may include an exposed thermal pad to improve heat transfer out of the electronic component (into the PCB). Heat transfer can be further facilitated by metal vias in the thermal pad. An open cavity QFN package is generally rectangular or square in profile with a wall extending upward from and surrounding a package floor. The floor is referred to as being recessed with respect to the surrounding wall. Herein, the terms "recessed floor" and "open cavity" may be used interchangeably.

As used within this disclosure, a "side emitting electronic device" refers to an electronic device configured to emit sonic or electromagnetic energy from a side surface that is substantially orthogonal to a bottom surface which may have one or more electrical contacts. With surface mount devices, the "bottom surface" generally refers to the part of the device that mounts and/or electrically connects to a mounting surface, while the "top surface" generally refers to a surface opposing (and generally parallel to) the bottom surface which also may have electrical contact. A "side surface" refers to any surface orthogonal to and generally spanning between the top surface and the bottom surface. Similarly, a "side sensing electronic device/component" refers to an electronic device configured to sense and/or receive sonic or electromagnetic energy from a side surface that is substantially orthogonal to the bottom surface.

Reference will now be made in detail to embodiments of the present invention, examples of which are illustrated in the accompanying drawings. Wherever possible, the same reference numbers are used in the drawings and the description to refer to the same or like parts.

Figure 1B:
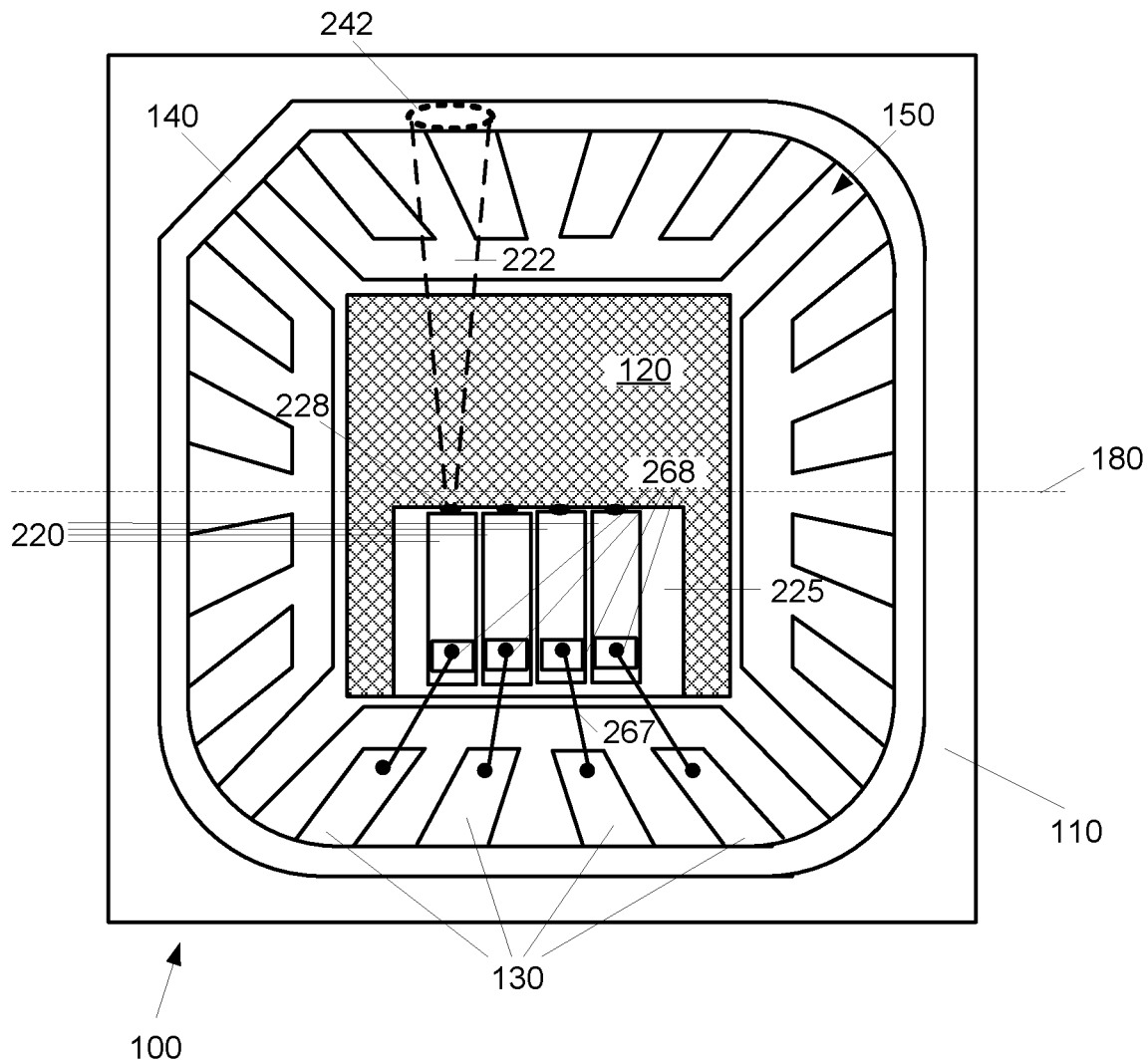
FIG. 1B is a top view of the recessed QFN package of FIG. 1A.

This application is directed to semiconductor emitter or detector devices, for example, a side emitting semiconductor laser diode, or an array thereof, or an electromagnetic detector such as an optical detector, housed in a modified QFN (Quad Flat No-leads) package. FIG. 1A is a side cutaway view of an open cavity QFN package 100 with a floor 120 within a recessed region 150. The floor 120 is generally made up of different sections such as an insulating material and an electrically conductive material. FIG. 1B is a top view of the prior art open cavity QFN package 100. While the embodiments described herein are generally directed to a package for a laser diode array for exemplary purposes, the package may be used for other types of electronic components, for example but not limited, a sensor, receiver, and/or antenna.

The package 100 may initially (before singulation, as described below) be generally rectangular in shape, with an (initially) encircling wall 110 generally with a wall inclined surface 140 surrounding the perimeter of a recessed floor 120. A plurality of QFN electrical contacts 130 are disposed on the floor 120 and/or the wall surface 140 which may be inclined up to 20 degrees from perpendicular to the floor, providing electrical connectivity to package contacts (not shown) on the exterior of the QFN package 100.

A laser diode array 225 mounted in the recessed region 150 of the QFN package 100 under a first exemplary embodiment is in electrical connection with the floor 120. The laser diode array 225 includes an array of one or more side emitting laser diodes 220. An electrical connection between each laser diode 220 in the laser diode array 225 may be made, for example, by one or more wire bonds 267 connecting to an electrical connection 268 (for example, a wire bond pad) on top of each respective laser diode 220 and a respective one of the QFN electrical contacts 130. It should be noted that in general electrical connection pads are omitted from the drawings for purposes of clarity. Depictions of the QFN package prior to singulation are labeled 100, while depictions of the QFN package after singulation are labeled 300.

The side emitting laser diodes 220 are oriented so that a laser beam 222 is emitted from an aperture 228 in each laser diode 220 of the laser diode array 225 in a direction toward a singulation plane 180, for example, a plane bisecting the QFN package 100 across the floor 120 and two opposing walls 110. The laser beam 222 is projected outward from each laser diode 220 of the laser diode array 225 substantially parallel to the floor 120 upon an opposite wall portion 242 of the wall inclined surface 140 that intersects with the laser beam 222. FIG. 2B only shows one laser beam 222 for purposes of clarity. The floor 120 the laser diode array 225 is mounted upon may be a metallic lead frame, preferably copper, for cooling purposes.

As noted above, the walls 110 of the QFN package 100 obstruct the path(s) of laser beam(s) 222 from the laser diode(s) 220. The QFN package 100 may be singulated, for example, along a singulation plane 180 (hereafter referred to as a singulation plane 180), such that the laser beam(s) 222 may project outward from the laser diode(s) 220 unobstructed by the wall 110.

The singulation plane 180 is substantially normal to the recessed floor 120, so the singulated end portions 285 (FIG. 3A) of the wall 110 is also substantially normal to the recessed floor 120. The singulation of the QFN package 100 may be performed by any of several conventional singulation means, for example, sawing or laser cutting. While FIG. 2B shows a single singulation plane 180, in alternative embodiments the QFN package 100 may be singulated in two or more locations, for example, to further reduce the size of the modified QFN package 300, and/or to position the singulation plane 180 closer relative to the laser diodes 220 to avoid any spreading of the laser beam 222 from intersecting with the floor 120 of the modified QFN package 300.

Figure 2A:
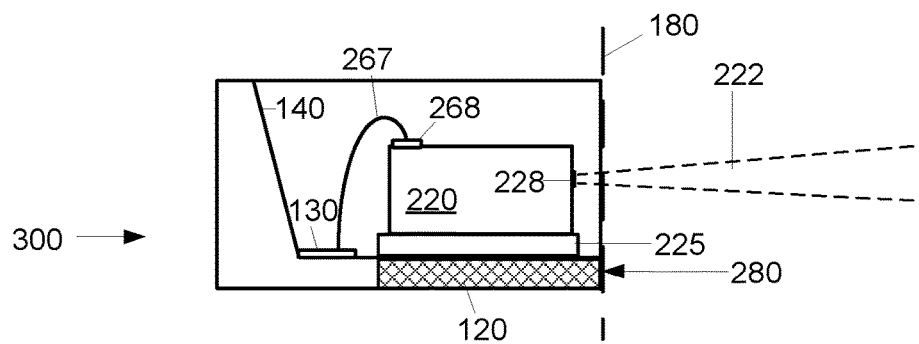
FIG. 2A is a cross sectional schematic diagram of an exemplary first embodiment of a modified QFN laser diode package after singulation.
Figure 2B:
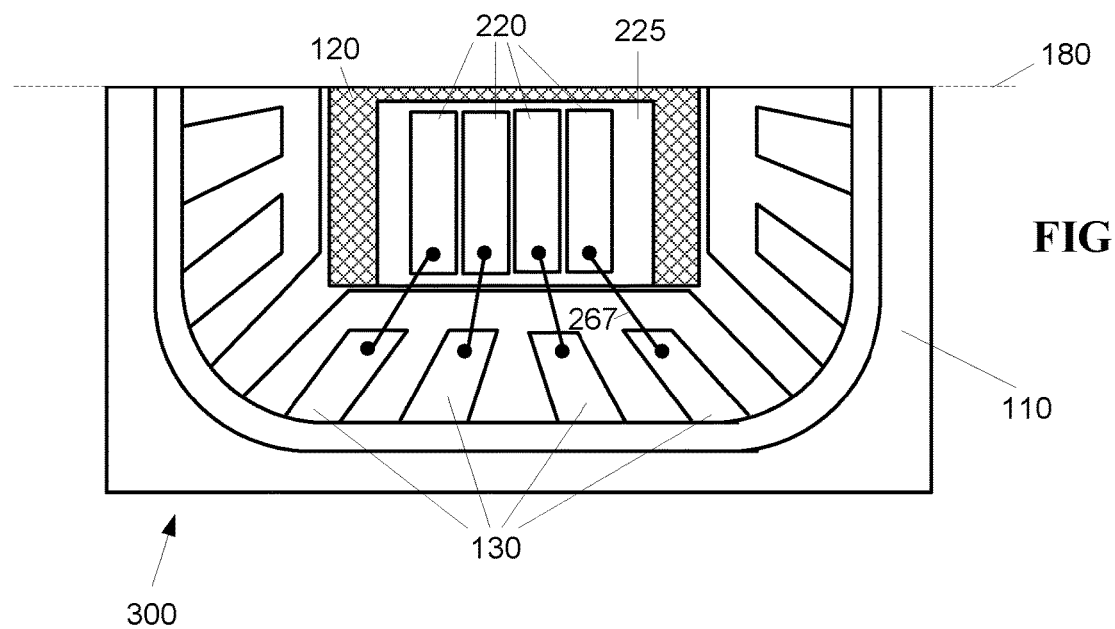
FIG. 2B shows, from a top view, the first embodiment QFN laser diode package of FIG. 2A.
Figure 3A:
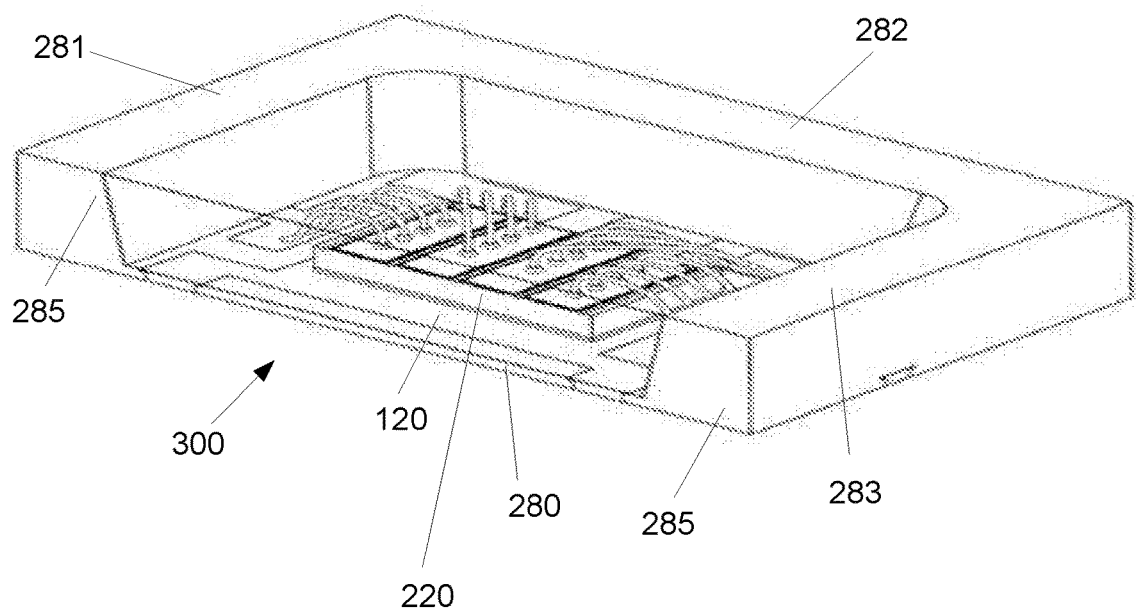
FIG. 3A shows from a perspective view, the first embodiment QFN laser diode package of FIG. 2A.
Figure 3B:
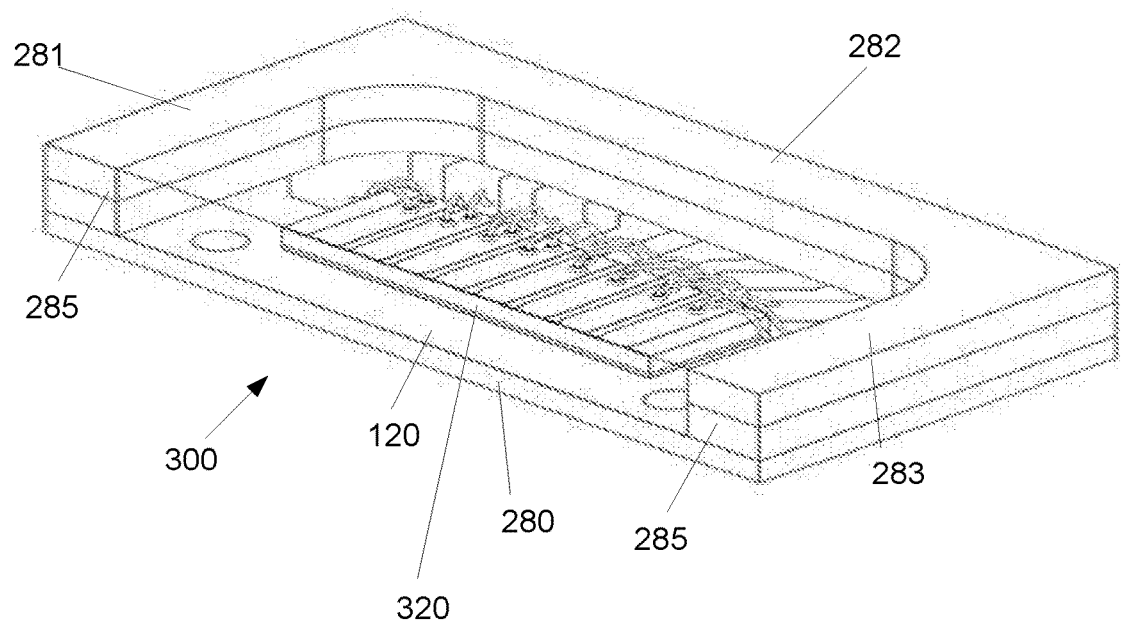
FIG. 3B shows an exemplary second embodiment of a modified QFN laser diode package from a perspective view.

FIGS. 2A-2B show modified QFN laser diode packages 300 after singulation. FIG. 2A shows an exemplary first embodiment of a modified QFN laser diode package 300 after singulation from a side view. FIG. 2B shows the first embodiment QFN laser diode package 300 of FIG. 2A after singulation from a top view. FIG. 3B shows an exemplary second embodiment of a modified QFN laser diode package 300 of FIG. 2A after singulation from a perspective view. The second embodiment is substantially similar to the first embodiment, although under the second embodiment an array of eight laser diodes 320 is used instead of an array of four laser diodes 220 (FIG. 3A). Alternative embodiments may have more or fewer laser diodes.

Like the first embodiment, the second embodiment has a walled portion 110 extending from and partially around a recessed floor portion further. The wall has a first walled portion section 281 substantially parallel to a third wall portion 283, spanned by a second wall portion 282 between the first wall portion 281 and the third wall portion 283. An un-walled singulated floor portion 280 extends between the first wall portion 281 and the third wall portion 283, such that there is no wall opposite the second wall portion 282, and the wall 110 may be characterized as being substantially U-shaped. The U-shaped wall 110 may be contrasted with an alternative package (not shown) having a walled recessed floor with a small opening or notch in the wall to accommodate passage of a light beam. For example, unlike a notched QFN package, the package 300 of the first and/or second embodiment may be singulated into two separate packages, as explained below regarding FIG. 4B.

Figure 4B:
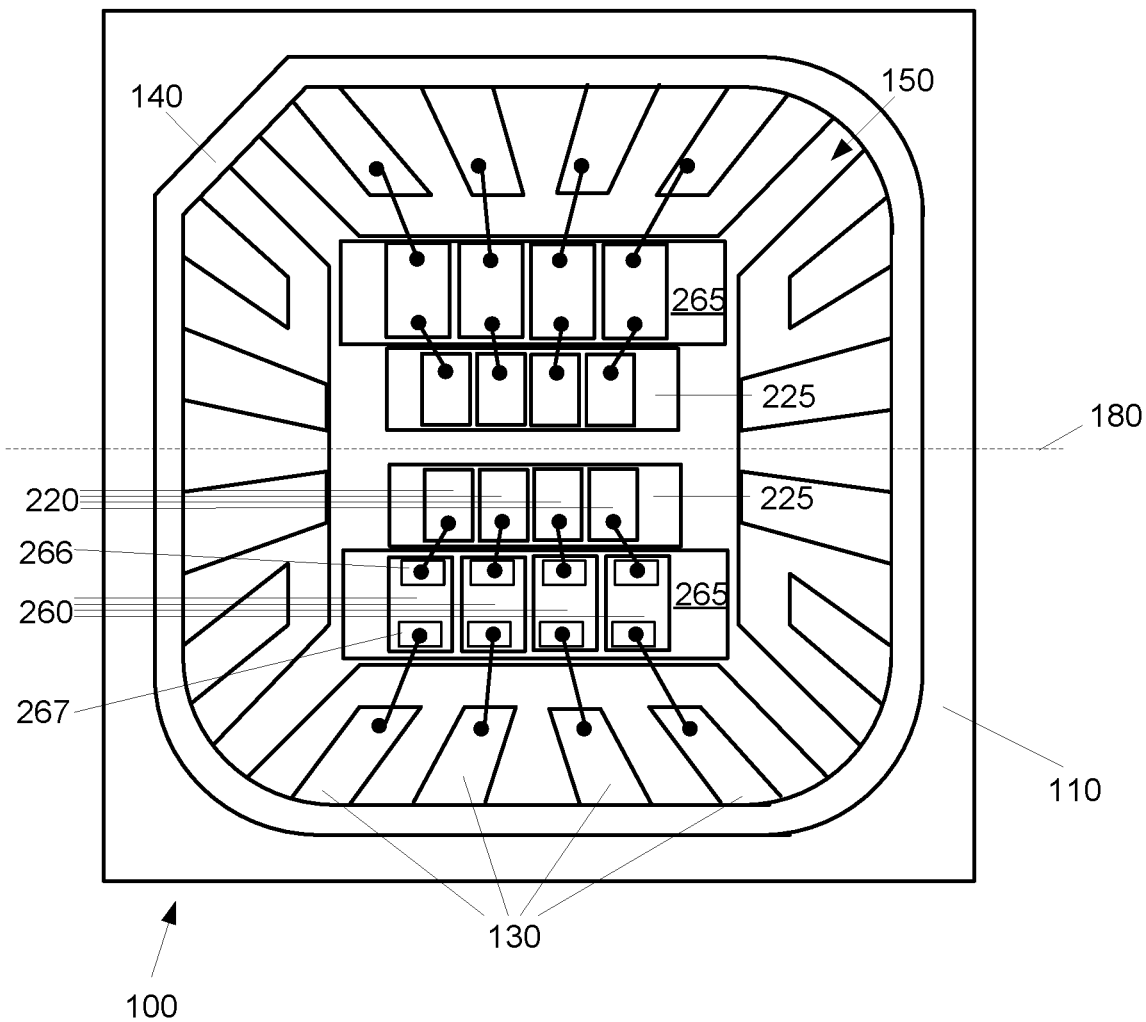
FIG. 4B shows, from a top view, the exemplary third embodiment of a modified QFN laser diode package.

Other embodiments may be based upon a similarly modified QFN package 100. FIG. 4B shows a third exemplary embodiment where a capacitor array 265 is mounted in the recessed region 150 of the package 100 adjacent to the laser diode array 225. The capacitor array 265 includes an array of one or more capacitors 260. Each capacitor of the array 265 may have two topside contacts 266 and 267 for its two electrical connections, or a top side electrical connection 266 and a bottom side electrical connection. A first electrical connection 221 (FIG. 4A) between each capacitor 260 in the capacitor array 265 and each laser diode 220 in the laser diode array 225 may be made, for example, by a wire bond 221 connecting to an electrical connection pad 268 on each respective laser diode 220 and to an electrical connection pad 266 on capacitor 260. A second electrical connection 261 (FIG. 4A) may be made between each electrical connection pad 267 on each capacitor 260 in the capacitor array 265 and a respective one of the QFN electrical contacts 130. Alternatively, a second electrical connection 261 (FIG. 4A) may be made between an electrical connection 269 of each capacitor 260 in the capacitor array 265 and a respective one of the QFN electrical contacts 130, for example by using solder or conductive epoxy.

Figure 4A:
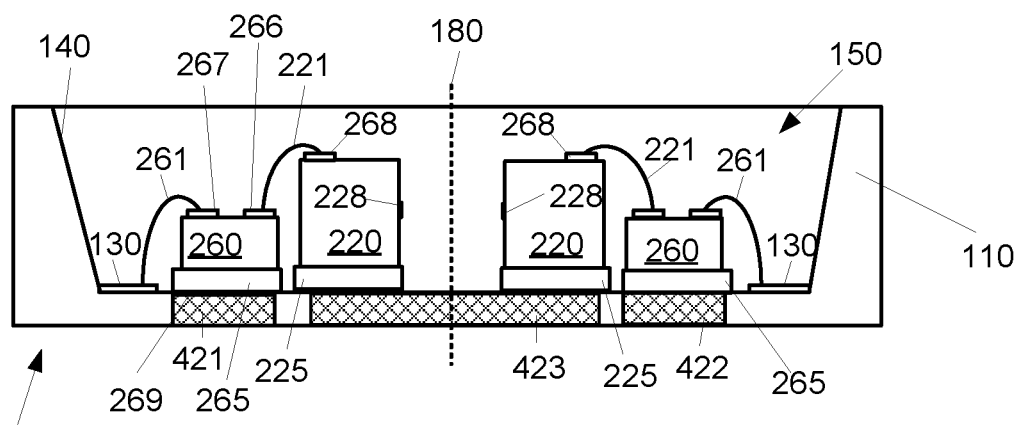
FIG. 4A shows, from a side view, an exemplary third embodiment of a modified QFN laser diode package where both sides of a singulation plane are populated with components before singulation.

The floor 120 (FIG. 1B) of the first embodiment (for example, a standard lead frame) may be modified to allow independent electrical connections to the bottom of components mounted in the QFN package 100. For example, the floor 120 may be partitioned into two or more electrically isolated sections to accommodate additional electrical components. Alternatively, or in addition, the floor 120 may have one or more portions in a parallel plane above or below the main floor 120, with a step up and/or down in the floor 120 between the two or more electrically isolated sections. As shown in FIG. 4A, under the third embodiment, a first floor portion 421 is positioned under the capacitor array 265 on a first side of the singulation plane 180, a second floor portion 422 is positioned under the capacitor array 265 on a second side of the singulation plane 180, and a third floor portion 423 spans beneath the laser diode arrays 225 on either side of the singulation plane 180, where the first floor portion 421, the second floor portion 422, and the third floor portion 423 are electrically isolated sections (for example, of a lead frame). The laser diode arrays 225 on either side of the singulation plane 180 are electrically isolated after singulation along the singulation plane 180, resulting in two substantially identical modified QFN laser diode packages. In alternative embodiments the floor may be partitioned differently (in different locations) to provide electrical isolation of electrical components mounted upon the floor partitions.

It should be noted that while FIG. 4B shows a one-to-one correspondence between the laser diodes 220 and the capacitors 260, there may be a 1-to-n correspondence, where n capacitors 260 may correspond to each laser diode 220. In alternative embodiments there may be additional components mounted within the recessed region 150.

Figure 5B:
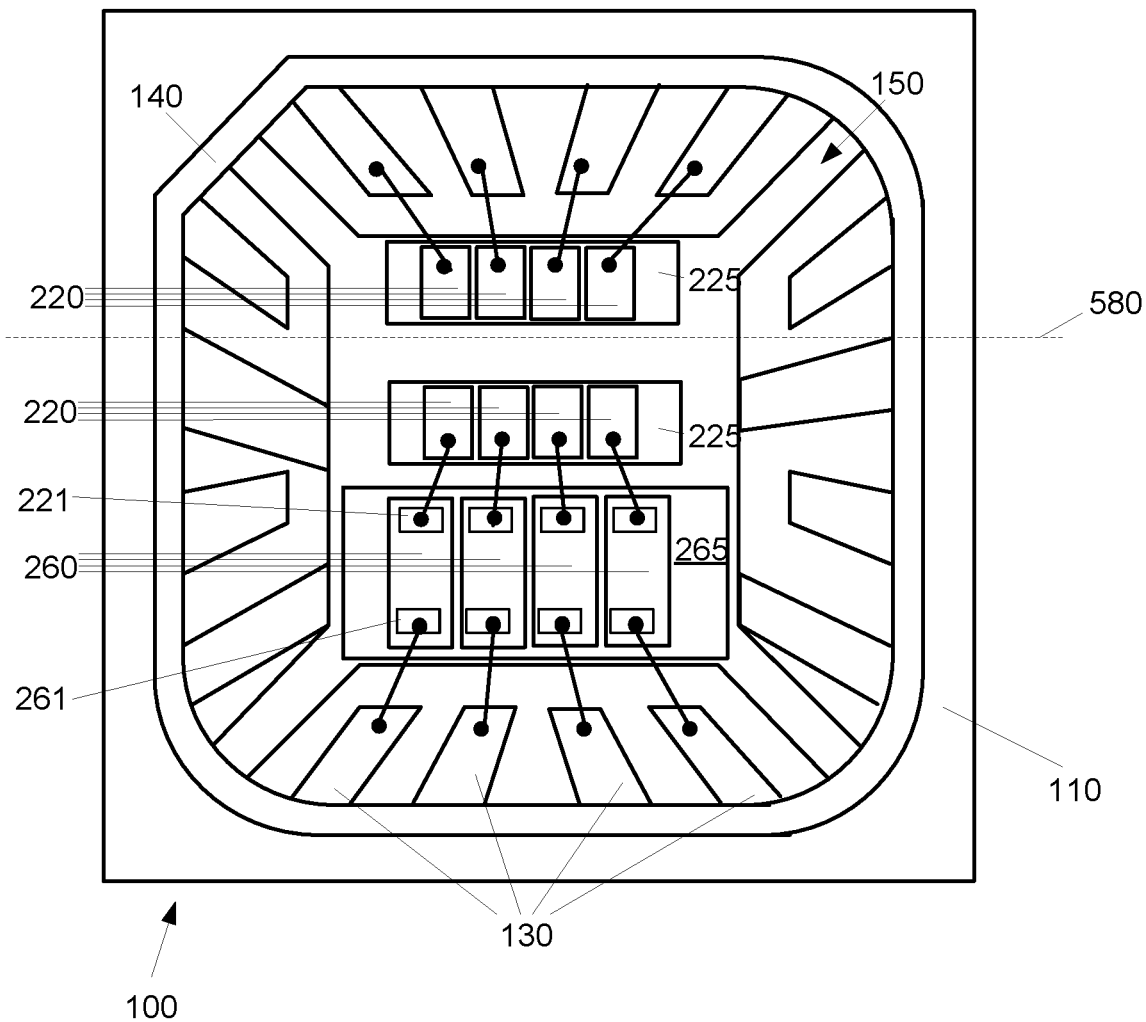
FIG. 5B shows the fourth embodiment of a modified QFN laser diode package of FIG. 5A from a top view.

Singulation may be performed before or (preferably) after the laser diodes (and/or other components, if any) are mounted in the QFN package 100. As shown in FIGS. 4A-4B, if space permits, two matching opposite sets of laser diode components 220, 260 may be mounted on each side of the singulation plane 180, so that each original QFN package 100 is split into two modified QFN packages 300 after singulation. While FIGS. 4A-4B show matching sets of opposing components, in an exemplary fourth embodiment, for example, as shown in FIGS. 5A-5B, different component may be mounted on either side of the singulation plane 580, for example, as shown, a first side having both a capacitor array 265 and a laser diode array 225, and a second side having only a laser diode array 225.

Figure 5A:
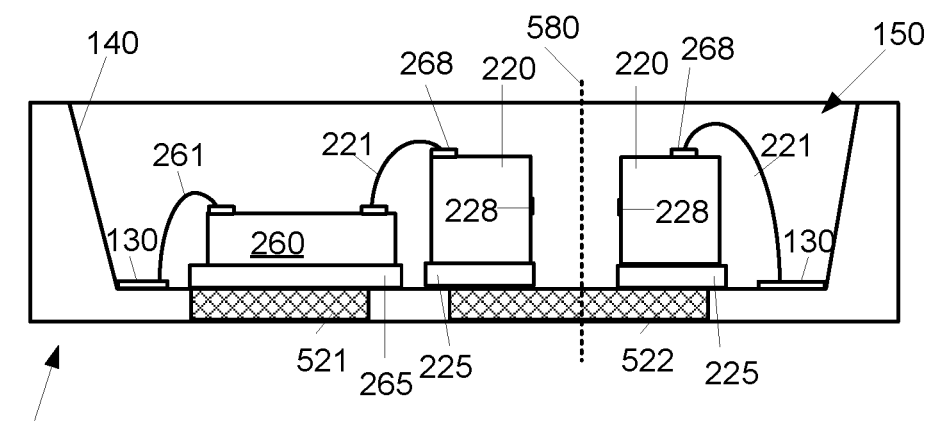
FIG. 5A shows an exemplary embodiment fourth of a modified QFN laser diode package from a side view where both sides of the singulation plane are asymmetrically populated with components before singulation.

As shown in FIG. 5A, a first floor portion 521 is positioned under the capacitor array 265 on a first half of the singulation plane 580, and a second floor portion 522 spans beneath the laser diode arrays 225 on either side of the singulation plane 180. The laser diode arrays 225 on either side of the singulation plane 580 become electrically isolated after singulation of the QFN package 100 along the singulation plane 580. It should be noted while FIG. 5A shows both the wire bond 261 and the 521 leadframe under the capacitor 260, in practice only one or the other is used.

Figure 5C:
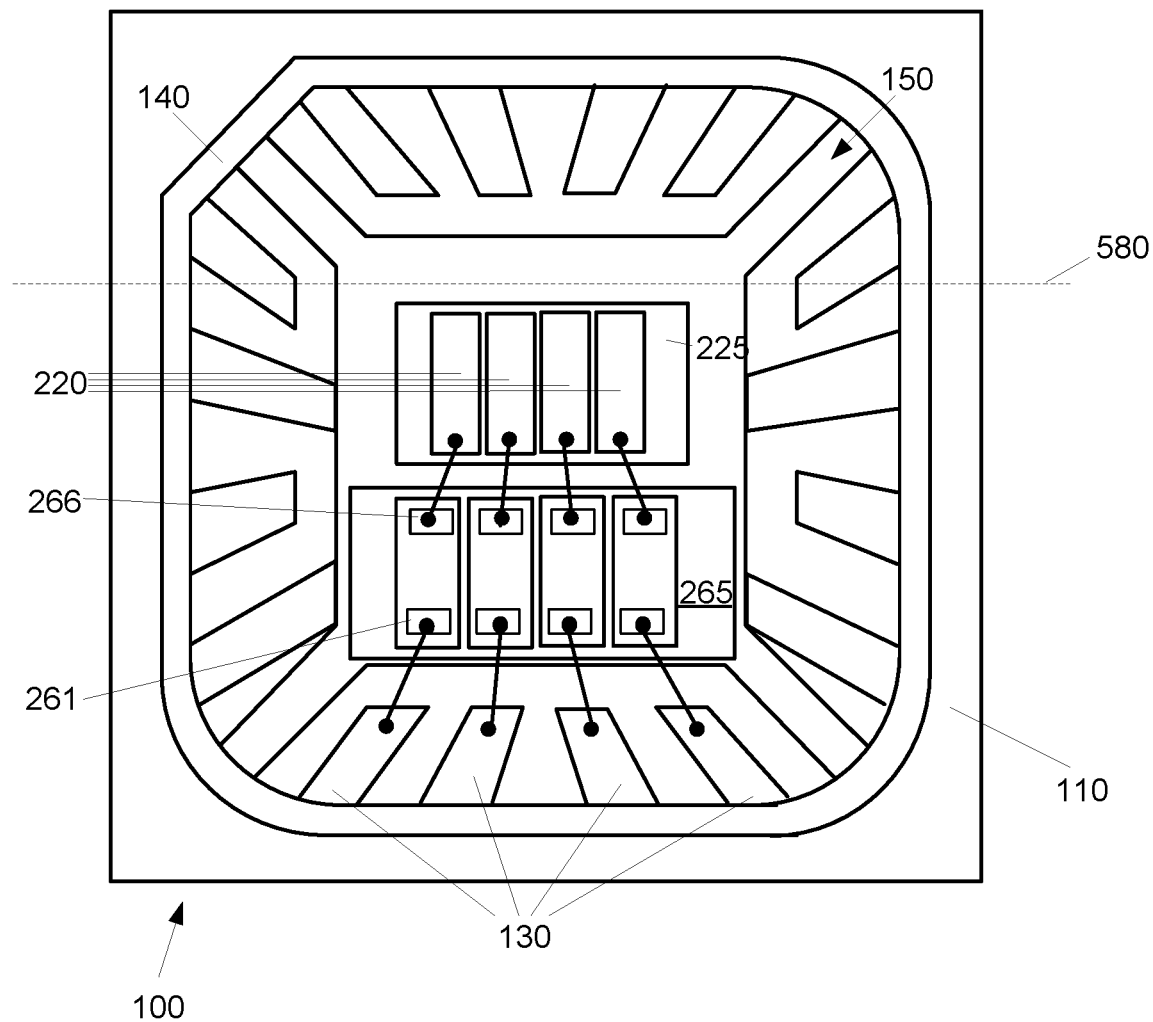
FIG. 5C shows, from a top view, an alternative embodiment of a modified QFN laser diode package of FIG. 5A where only one side of the singulation plane is populated with components before singulation.

FIG. 5C shows, from a top view, an alternative embodiment of a modified QFN laser diode package of FIG. 5A where only one side of the singulation plane 580 is populated with components before singulation. As with previously described embodiments, the floor of the QFN package 100 may be partitioned to electrically isolate electrical components mounted within the QFN package 100.

Figure 8A:
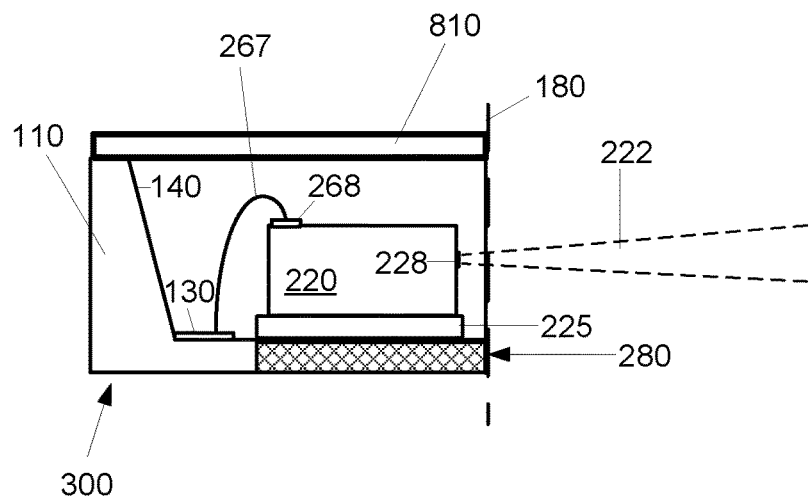
FIG. 8A is schematic diagram showing an alternative embodiment of a modified QFN package with a cover.
Figure 9A:
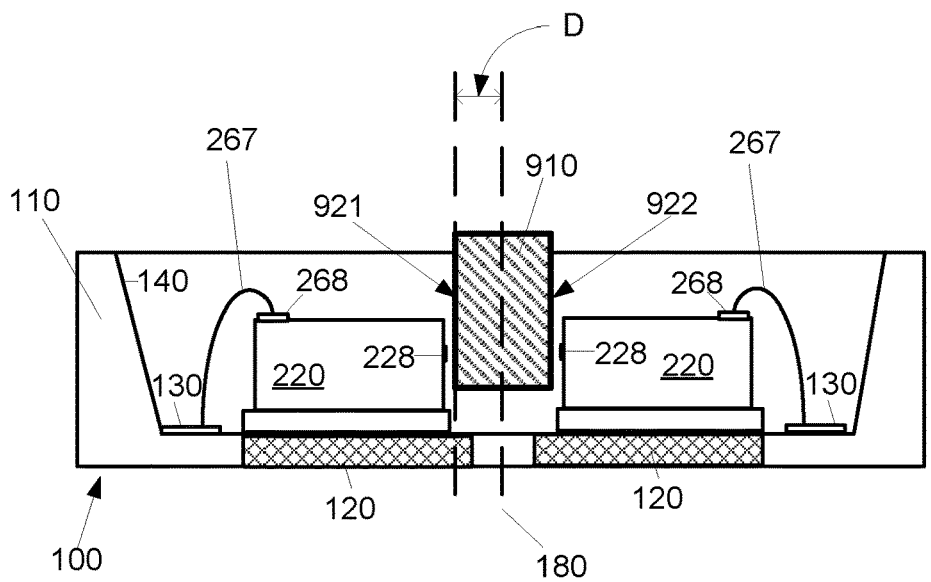
FIG. 9A is a schematic diagram showing a first alternative embodiment of a mold for a modified QFN package.
Figure 9B:
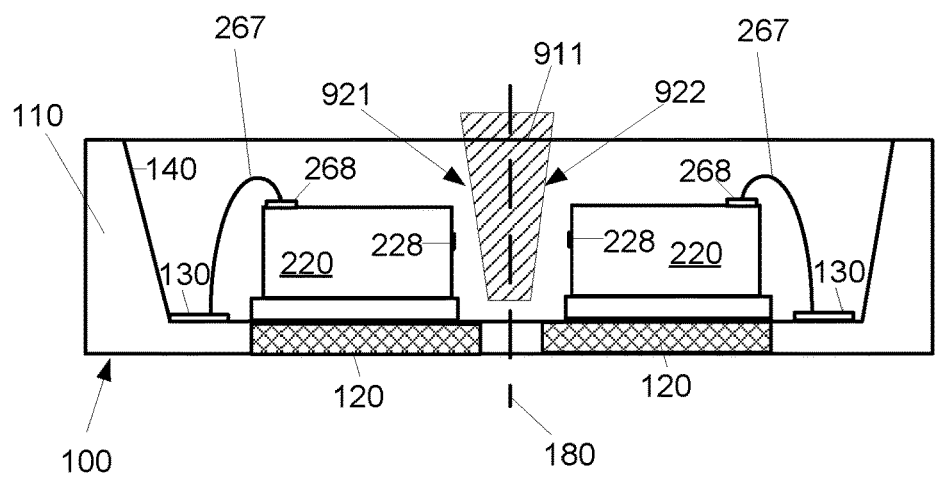
FIG. 9B is a schematic diagram showing a second alternative embodiment of a mold for a modified QFN package.
Figure 9C:
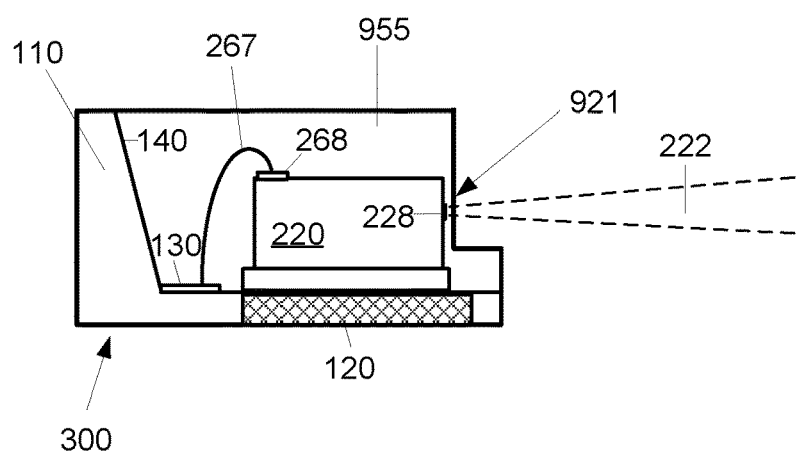
FIG. 9C is a cross sectional schematic diagram of the modified QFN package of FIG. 9A after singulation.
Figure 9D:
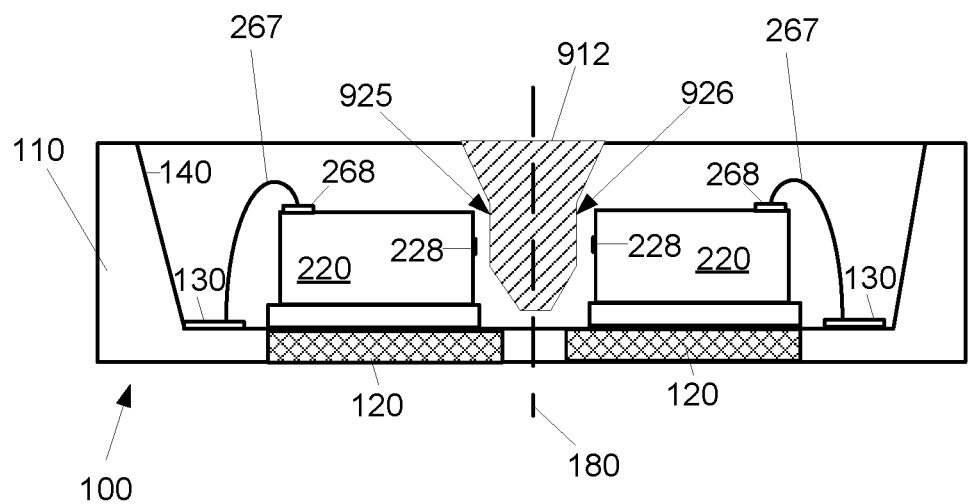
FIG. 9D is a schematic diagram showing a third alternative embodiment of a mold for a modified QFN package.
Figure 9E:
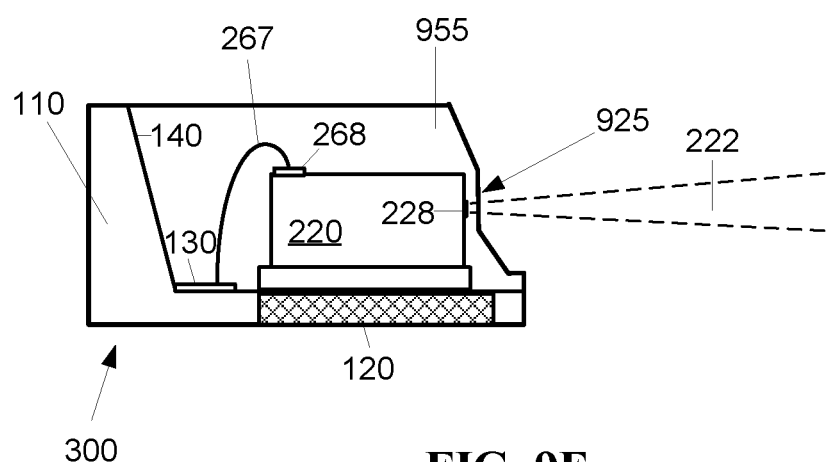
FIG. 9E is a cross sectional schematic diagram of the modified QFN package of FIG. 9D after singulation.

The modified QFN packages 300 may be covered, for example, with a cover 810 as shown by FIG. 8A, or filled, for example, with a transparent resin potting material (filling 955 (FIG. 9C)) before singulation, for example, an epoxy transparent to the optical wavelength of light emitted from the laser diode 220. The cover 810 or filling 955 may be polished after singulation to allow a clear path that minimally distorts the shape of the laser beams 222 (FIG. 1B). Alternatively, as shown by FIGS. 9A-9C, the resin may be applied with a mold before singulation, for example with a removable mold block 910 positioned along the singulation plane 180 adjacent to the aperture 228 of the side emitting laser diode 220, so that smooth exit windows 921, 922 are formed in the filling 955 by the mold block 910 along to the singulation plane 180 at a distance D from the singulation plane 180 so the exit windows 921, 922 are not cut during the singulation process. As a result, the smooth exit windows 921, 922 do not have to be polished since the smooth exit windows 921, 922 are not abraded during the singulation process. FIG. 9A and its singulated state 9C show the exit windows 921, 922 normal to the path of the laser beam 222, while FIG. 9B shows the mold 911 may be shaped so the exit windows 923, 924 has a slight draft angle with respect to the singulation plane 180, for example 20 degrees or less (FIG. 9B), to facilitate removing the mold block 910 from the package 100 before singulation. The laser chip 220 may be arranged so that the laser beam 222 is normal to the surface of the exit window 923, 924. Alternatively, as shown by FIGS. 9D-9E, the mold 912 may be shaped with a draft angle on some portions and not on others, such that a small region of the exit windows 925, 926 adjacent to the aperture 228 where the beam 222 exits the laser diode 220 may be arranged to be normal to the beam 222.

Figure 8B:
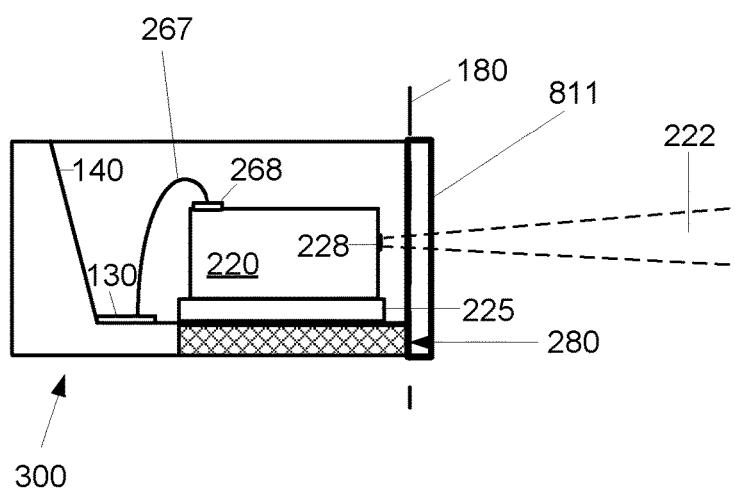
FIG. 8B is schematic diagram showing an alternative embodiment of a modified QFN package with a side window.
Figure 8C:
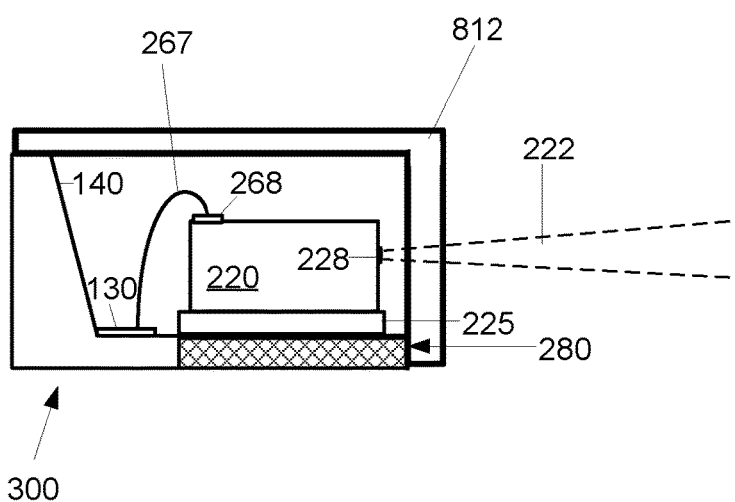
FIG. 8C is schematic diagram showing an alternative embodiment of a modified QFN package with a combination cover and side window.

As shown by FIGS. 8B and 8C, a side window 811 or a cover and side window combination 812 may be attached to the modified QFN package 300 after singulation. The cover 810 (FIG. 8A) may be added before singulation if it does not complicate the singulation process. The cover 810 may be opaque, as it is a mechanical feature that does not obscure the laser light. The cover 810 is preferably similar in length and width to the top area of the modified QFN package 300 but may be larger or smaller than the top area.

The window 811, 812 is optically clear, preferably thin (for example, "Corning® Gorilla® Glass" or similar thin window materials used for smart phone screens and other applications) but may be, for example, but not limited to up to 3 mm thick, preferably in the range of 25 µm to 3 mm thick. The window 811 has a length and width large big enough so that it is larger than a size of the beam 222, for example a minimum of 500 µm by 25 µm.

The side window 811 or the cover and side window combination 812 is preferably formed of a material that will withstand a long term exposure to a temperature range up to greater than 150° C. created by the heat generated by the side emitting laser diode 220/225 and the adjacent environment, for example the material can be Lexan or soda lime glass. The side window 811 or the cover and side window combination 812 may be used instead of a transparent resin fill, or in combination with a transparent resin fill. Alternatively, the modified QFN package 300 may be made and/or used without a fill, cover, or side window.

In embodiments with capacitors, for example, the third embodiment shown in FIGS. 4A-B, the array of one or more capacitors 260 may include one or more of discrete connected capacitors and silicon process technology connected capacitors made using a mask. The silicon process technology connected capacitor may have a predetermined dimension related to a required capacitance value. For example, by adjusting a dimension of the capacitor, a desired capacitance value may be arrived at. The individual silicon capacitors may be made using a mask set and silicon process technology to industry standard sizes and capacitance values.

Alternative embodiments may add more circuitry to the above package, such as a monitoring photodiode, an APD (Avalanche Photo Diode), etc. Component combinations inside the QFN package may be, for example, laser diode only, laser diode and capacitor array, laser diode and photodiode, laser diode and current sensor, etc. A preferred package assembly may have a monolithic capacitor or a monolithic capacitor array but discrete components may also be implemented.

FIG. 6 is a flowchart of an exemplary method for forming a modified QFN laser diode package. It should be noted that any process descriptions or blocks in flowcharts should be understood as representing modules, segments, portions of code, or steps that include one or more instructions for implementing specific logical functions in the process, and alternative implementations are included within the scope of the present invention in which functions may be executed out of order from that shown or discussed, including substantially concurrently or in reverse order, depending on the functionality involved, as would be understood by those reasonably skilled in the art of the present invention. The method is described below with reference to FIGS. 1A-1B. A side emitting laser diode 220 and/or an array 225 of side emitting laser diodes 220 is attached to a floor portion 120 of a recessed QFN package 100, wherein the side emitting laser diode 220 is oriented to direct a laser beam 222 toward an opposing portion 242 of a wall 110 extending upward from and substantially surrounding a recessed floor portion 120, as shown by block 610.

A first singulation plane 180 is determined between the side emitting laser diode 225 and the opposing portion 242 of the wall 110, as shown by block 620. The QFN package 100 is singulated into a first piece and a second piece along the first singulation plane 180, so that after singulation the opposing portion of the wall 242 is in the second piece and the side emitting laser diode 220/225 is in the first piece, as shown by block 630.

FIG. 7 is a flowchart of an exemplary method for forming a modified QFN package 300 for a side sensing electronic component. A side sensing electronic component and/or an array of side sensing electronic components is attached to a floor portion of a recessed QFN package 100, wherein the side sensing electronic component is oriented to sense sound/radiation from the direction an opposing portion of a wall extending upward from and substantially surrounding a recessed floor portion, as shown by block 710.

A first singulation plane is determined between the side sensing electronic component and the opposing portion of the wall, as shown by block 720. The QFN package is singulated into a first piece and a second piece along the first singulation plane, so that after singulation the opposing portion of the wall is in the second piece and the side sensing electronic component is in the first piece, as shown by block 730.

In summary, it will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for producing a semiconductor package, comprising the steps of:
   physically attaching a first side emitting laser diode to a recessed floor portion of a recessed flat no-leads (FNL) package comprising a wall extending from and substantially surrounding a perimeter of the recessed floor portion, wherein the first side emitting laser diode is oriented to direct a laser beam toward an opposing portion of the wall;
   determining a first singulation plane through the FNL package wall and floor portion between the first side emitting laser diode and the opposing portion of the wall; and
   singulating the FNL package into a first piece and a second piece along the first singulation plane,
   wherein after singulation the opposing portion of the wall is in the second piece and the first side emitting laser diode is in the first piece, and
   wherein the side emitting laser diode is oriented so that the laser beam is emitted from an aperture in the laser diode in a direction toward the singulation plane.

2. The method of claim 1, wherein the FNL package comprises a
   recessed quad flat no-leads (QFN) package.

3. The method of claim 2, further comprising the step of electrically connecting a circuit comprising the first side emitting laser diode to an electrical contact of the recessed QFN package.

4. The method of claim 2, wherein the singulation plane substantially bisects the QFN package demarking the first piece and the second piece.

5. The method of claim 2, further comprising the step of filling the recess portion the QFN with a transparent hardening resin.

6. The method of claim 5, further comprising the steps of:
   arranging a mold portion aligned with a portion the singulation plane adjacent to a beam aperture of the first side emitting laser diode, and
   with the mold portion, forming a smooth exit window of the transparent hardening resin apart from the singulation plane, wherein the singulating does not singulate the smooth exit window.

7. The method of claim 2, further comprising the step of covering the recess portion the QFN with a cover and/or attaching a transparent window along the singulation plane of the first piece.

8. The method of claim 2, further comprising the steps of:
determining a second singulation plane substantially parallel to the first singulation plane between the side emitting laser diode and the first portion of the wall; and
singulation the QFN package along the second singulation plane.

9. The method of claim 2, wherein the first side emitting laser diode is one of a plurality of side emitting laser diodes in a first laser diode array.

10. The method of claim 2, further comprising the step of:
physically attaching a second side emitting laser diode to the floor portion of the recessed QFN package substantially opposite the first side emitting laser across the first singulation plane,
wherein after singulation the second side emitting laser diode is in a the second piece.

11. The method of claim 10, wherein the second side emitting laser diode is one of a plurality of side emitting laser diodes in a second laser diode array.

12. The method of claim 10, further comprising the step of electrically connecting the second laser diode to a circuit electrically connecting to the QFN package second piece.

13. The method of claim 1, further comprising the step of electrically connecting the first laser diode to a circuit electrically connecting to the QFN package first piece.

14. An electronic circuit package, comprising:
a recessed flat no-leads (FNL) package comprising:
a wall extending in a direction normal from and partially surrounding a recessed floor portion, the wall further comprising a first walled portion section substantially parallel to a third wall portion, the first and third walled portions spanned by a second wall portion; and
an un-walled floor portion spanning between the first walled portion and the second walled portion substantially opposite the second walled portion;
a side facing emitting and/or sensing electronic component attached to the floor portion of the recessed FNL package via a bottom surface, wherein the electronic component is oriented to direct emission and/or detection toward the un-walled portion, wherein the electric component is electrically connected to at least one electrical contact in the recessed floor portion of the recessed FNL package.

15. The electronic circuit package of claim 14, wherein the FNL package comprises a recessed quad flat no-leads (QFN) package and the wall extends from only three of four edges of the recessed floor portion.

16. The electronic circuit package of claim 15, wherein the un-walled portion corresponds to a singulation plane along an edge of the recessed floor of the QFN package.

17. The electronic circuit package of claim 15, wherein the electrical contact of the QFN package comprises an electrical connecting pad disposed on the package floor and/or wall.

18. The electronic circuit package of claim 14, wherein the wall is substantially U-shaped.

19. The electronic circuit package of claim 14, further comprising:
a transparent potting material covering the floor portion and the side facing emitting and/or sensing electronic component; and
a smooth exit window in the potting material along the un-walled floor portion.

20. A method for producing a semiconductor package, comprising the steps of:
physically attaching a first side sensing electronic component to a floor portion of a recessed flat no-leads (FNL) package comprising a wall extending from and substantially surrounding perimeter of a recessed floor portion, wherein first side sensing electronic component is positioned to orient a sensing and/or detection region parallel to the recessed floor portion toward an opposing portion of the wall;
determining a first singulation plane between the first side sensing electronic component and the opposing portion of the wall; and
singulating the FNL package into a first piece and a second piece along the first singulation plane,
wherein after singulation the opposing portion of the wall is in the second piece and the first side sensing electronic component is in the first piece, and
wherein the side emitting laser diode is oriented so that the laser beam is emitted from an aperture in the laser diode in a direction toward the singulation plane.

* * * * *